United States Patent [19]

Suzuki et al.

[11] Patent Number: 4,886,571

[45] Date of Patent: Dec. 12, 1989

[54] SURFACE TREATMENT AND APPARATUS THEREFOR

[75] Inventors: Keizo Suzuki, Kodaira; Susumu Hiraoka; Shigeru Nishimatsu, both of Kokubunji, all of Japan

[73] Assignee: Hitachi, Ltd., Tokyo, Japan

[21] Appl. No.: 302,334

[22] Filed: Jan. 27, 1989

[30] Foreign Application Priority Data

Feb. 24, 1988 [JP] Japan .................................. 63-39386

[51] Int. Cl.⁴ ...................... B44C 1/22; H01L 21/306; C23C 14/00; B05D 3/06
[52] U.S. Cl. .................................... 156/646; 118/724; 156/643; 156/345; 427/38
[58] Field of Search ...................... 156/345, 643, 646; 427/38; 118/724, 725, 728, 50, 50.1, 620, 641; 204/192.11, 192.32, 192.34, 192.35, 298

[56] References Cited

U.S. PATENT DOCUMENTS 4,522,674  6/1985  Ninomiya et al. .................. 156/345

Primary Examiner—William A. Powell
Attorney, Agent, or Firm—Antonelli, Terry & Wands

[57] ABSTRACT

An apparatus for surface treating a sample article with activated particles, comprising a reaction chamber in which a sample article to be surface processed is placed, means for introducing a reaction gas into the reaction chamber, an activation surface properly set in the reaction chamber and arranged capable of activating at least one part of the particles composing the reaction gas, and means for evacuating the used reaction gas out of the reaction chamber.

32 Claims, 5 Drawing Sheets

SURFACE TREATMENT AND APPARATUS THEREFOR

BACKGROUND OF THE INVENTION

This invention relates to a dry process for surface treatment of solid products, and an apparatus therefor. More particularly, the invention relates to a surface treating method which is capable of realizing high throughput surface process especially suited for the production of semiconductor devices, and an apparatus therefor.

A surface treating apparatus capable of realizing dry process suited for the production of semiconductor devices is disclosed in Japanese Patent Application Kokai (Laid-Open) No. 35521/87. In this apparatus, a pertinent gas is heated in a furnace of high temperature to activate the gas chemically, and the activated gas is ejected into a vacuum to form active particle beams. These active particle beams are applied to the surface of the workpiece to perform the desired surface treatment. In this apparatus, the operations are carried out by controlling the internal pressure of the furnace at about 1 Torr while keeping the vacuum to the order of $10^{-3}$ Torr or below.

According to said prior art techniques, the gas particles which have reflected off the workpiece surface without undergoing a reaction are evacuated out and play no part in the surface treatment. There are occasions where some of the active particles, even though impinging on the workpiece surface, reflect off the surface without reaction, and in such locations, if the workpiece temperature is low, most of the reflected particles become inactive and are discharged out. Needless to say, the non-activated particles won't react even if impinging on the substrate surface.

Thus, in the prior art, little consideration has been given to the efficient utilization of gas particles for the surface treatment, and the problem of low throughput has remained unsolved.

SUMMARY OF THE INVENTION

The object of this invention is to provide a high throughput process for surface treatment and an apparatus therefor. The "surface treatment" referred to in this invention involves, for instance, removal (etching) of substrate surface material, deposition or epitaxy of a material on the substrate surface, modification (by oxidation, nitridation, doping, etc.) of the surface material of the substrate.

Said object of the invention can be attained by placing an activation surface (the surface having an activating function) of the gas particles in the same chamber (reaction chamber) in which the substrate is placed and bringing the surface-activated particles to the substrate surface to effect the desired surface treatment. When the expression "two points A and B exist in the same chamber" is used in this specification, it means that the gas pressures measured at the points A and B are equal or differ only slightly (the difference being, for instance, less than 10 times although the allowable amount of difference varies depending on the situation). According to this method and apparatus, the gas particles which were not reacted on the substrate surface can be again activated, so that it becomes possible to let one particle enter the substrate surface a plural number of times as an active particle, thus enabling drastic improvement of throughput.

As the gas particle activation surface, there can be used, for instance, a surface heated to a high temperature, a surface having a catalytic effect, or a combination of such surfaces. These are but some examples, and it is possible to use any surface capable of chemical activation of particles.

The "particles (or gas particles)" referred to herein mean the atoms, molecules or the positively or negatively ionized version thereof. The "active particles" mean the chemically active particles. They include, for instance, the radical particles (the particles having unpaired electrons or dangling bonds), the particles excited at least at one of the electronic state, rotational state and vibrational state, and the particles whose translational energy per one degree of freedom is greater than the energy (about $1.3 \times 10^{-2}$ ev) at room temperature (about 20° C.). Generally, surface treatment with little damage, low contamination, high selectivity and at low temperature is ideal in a semiconductor process. For realizing such treatment, it is desirable that the overall energy of the active particles (total energy that the active particles can release on the substrate surface) is less than 10 ev.

In some cases, directional surface process (such as vertical etching) is desirable for the surface treatment. In such cases, it is recommended to set a collimator between the activation surface and the substrate surface. This makes it possible to orientate the active particles applied to the substrate surface and to perform the desired directional surface process.

The present invention is characterized by the increased throughput owing to the fact that the gas particles enter the substrate surface during being activated a plural number of times on the average since the activation surface and the substrate surface exist in the same chamber. The invention is also suited for realizing surface treatment with little damage, low contamination, high selectivity and at low temperature as the activation surface can chemically activate the gas particles and the total energy possessed by the active particles can be kept below 10 ev.

DETAILED DESCRIPTION OF THE PREFERRED EMBODIMENTS

Figure 1:
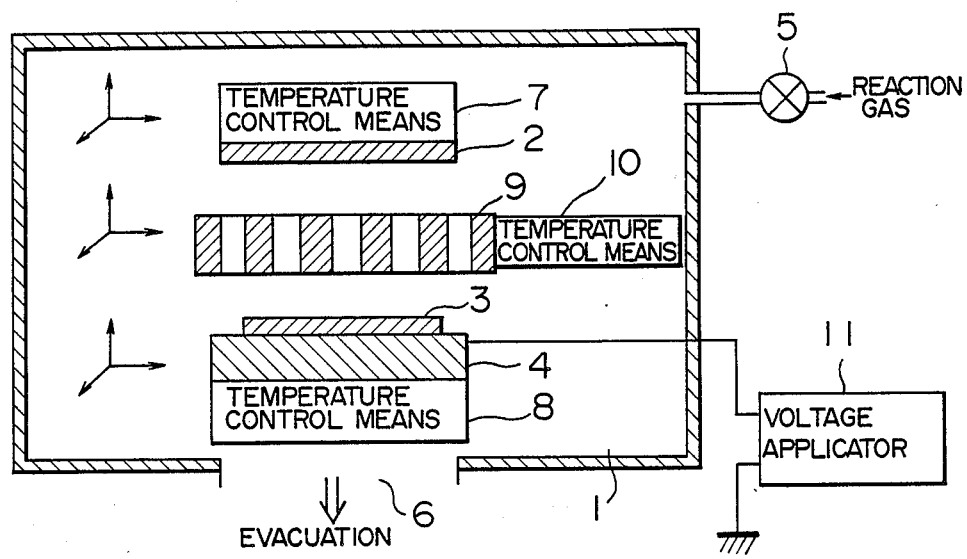
FIG. 1 is a sectional view of an embodiment of the present invention.

The makeup of the apparatus in an embodiment of this invention will be described below with reference to FIG. 1. An activation surface 2 and a sample 3 are set in a reaction chamber 1. If necessary, sample 3 may be held on a sample holder 4. A reaction gas is introduced into reaction chamber 1 through a valve 5 and evacuated out from a evacuation port 6 as required. The reaction gas may be a single gas or a mixture of different kinds of gas. The activation surface 2 may be heated or cooled by an activation surface temperature control means 7 as desired. Sample 3 may be also heated or cooled by a sample temperature control means 8 if such is necessary. Sample temperature control means 8 may double as sample holder 4 or may be provided separately from sample holder 4. Further, a collimator 9 may be set between said activation surface 2 and sample 3. The surface temperature of said collimator 9 is controlled by a collimator temperature control means 10 as required. A voltage application means 11 is provided to apply a voltage to the sample 3 for accelerating or decelerating the particles toward the sample 3 when such is necessary. Said both collimator 9 and sample holder 4 may be designed to be operable by a one-, two- or three-dimensional mechanism. If necessary, activation surface 2 may be also arranged similarly operable. A means for controlling the wall temperature of reaction chamber 1 may be provided as desired.

The activation surface 2 used in the present invention will be described below in detail. This activation surface 2 is a surface by which the gas particles are activated on touching it to form active particles R. The "particles" and "active particles" mentioned here have already been explained before. Such activation surface can be realized by a high-temperature solid surface or a solid surface having a catalytic effect. In the latter case, the solid surface may not necessarily be high in temperature.

As the material for forming a high-temperature solid surface, it is recommended to use $Al_2O_3$ (such as alumina and ruby), $SiO_2$ (such as quartz and rock crystal), C (such as graphite and polycrystalline carbon), Si (single crystal and polycrystal), Si-C (Si and C alloy or mixture) and the like which have high heat and chemical resistance and are advantageous in terms of durability.

A material with small heat radiation is especially suited for practical use as it is possible with such material to obtain a high-temperature surface with a low heating power. Such material differs depending on the temperature of the activation surface, but in case the temperature of the activation surface is in the range of 1,000° to 2,000° C., stainless steel, $ZrO_2$, W, $TiO_2$, $2MgO\cdot 2Al_2O_3\cdot 5SiO_2$, $SiO_2$ and the like are suited.

In case of making use of catalytic effect, a material with a large work function, for example such metals as W, Mo, Ta, Ti, Ni, Nb, Pt, etc., or their alloys or mixtures can be used as the activation surface material. In case of utilizing a surface having catalytic effect, the apparatus is simplified as no heating means is required since the activation surface may be low in temperature. Of course, such surface having catalytic effect can be used in a high-temperature state. The activation surface used in this invention can be formed as a solid surface or a surface of a thin film formed on a solid, or as a liquid surface.

Gas molecules M can be made into radical active particles R by subjecting said gas molecules to thermal decomposition on the activation surface 2 heated to a high temperature. For instance, when $F_2$ gas is introduced as gas molecules M and the temperature $T_a$ of the activation surface is raised to higher than 500° C., more than 10% of the $F_2$ molecules reaching the activation surface 2 are decomposed as a result of the reaction of $$F_2 \rightarrow 2F \quad (1)$$

to form the radical active particles F. Also, when $Cl_2$ is used in place of M and the temperature $T_a$ is raised to higher than 800° C., more than 10% of the $Cl_2$ reaching the activation surface 2 undergo a similar thermal decomposition reaction of $$Cl_2 \rightarrow 2Cl \quad (2)$$

to form the radical active particles Cl. Further, when a surface with higher temperature ($T_a > 1,500°$ C.) is used, it is possible to form the active particles of O, $O_3$, N, etc., by introducing $O_2$ or $N_2$ gas as M. In forming such active particles, it is adviced to use $Al_2O_3$, $SiO_2$, C, Si-C or the like having excellent heat resistance and chemical reactivity as material of the activation surface. Even with such metals as W, Mo, Ta, Ti, Nb and Pt, it is possible to form the radical active particles R if the activation surface temperature $T_a$ is raised sufficiently (for example, Ta > 2,000° C.) since the reaction compound (for example, $WF_6$) which is corrosive of the activation surface is decomposed ($WF_6 \rightarrow W + 6F$) at high temperature and therefore no erosion of the activation surface takes place. However, a too high surface temperature would cause evaporation of the surface material, too, so that in this case, it is essential that $Ta \leq 3,000°$ C. Part of the active particles formed in the manner described above are ionized. Thus, the active particles R of $F^-$ or $Cl^-$ can be formed by decomposing and ionizing $F_2$ or $Cl_2$.

By controlling the surface temperature $T_a$ lower than the above specified range, it is possible to form the particles which are excited at least at one of the electronic state, rotational state and vibrational state or the particles whose translational energy per one degree of freedom is greater than the room temperature equivalent energy with no need of decomposing M. (These particles are hereinafter called "hot particles", and when the particles are molecules, they are usually called "hot molecules"). For example, when $F_2$ gas particles are used as M and the surface temperature $T_a$ is controlled at the level of 100 to 1,500° C., there can be formed the active particles R of $F_2$ hot molecules (hereinafter referred to as $F_2^*$). Likewise, when $Cl_2$ gas particles are used as M and Ta is controlled in the range of 100 to 2,000° C., there can be obtained the active particles R of $Cl_2$ hot molecules (hereinafter referred to as $Cl_2^*$). Also, when the particles containing the halogen elements such as FC1, $NF_3$, $CF_4$, $SF_6$, etc., are used as M, it is possible to form the hot particles of these elements. The hot molecules containing these halogen elements are useful for etching. By using as M the molecules containing an element to be deposited on the sample surface, it is possible to form the hot molecules suited for film deposition. For instance, for depositing Si, $SiH_4$ or $Si_nH_m$ can be used, and when it is desired to deposit Ga, As, P or B, there can be used $GaH_3$, $AsH_3$, $PH_3$, $BH_3$ or a gaseous mixture thereof. Hot molecules of $O_2$ or $N_2$ are usable for oxidation or nitriding.

Use of said hot particles can realize surface treatment with little damage and is suited for semiconductor production process. The activation surface used in the present invention is capable of forming such hot particles very effectively.

The geometry and structure of the activation surface in accordance with this invention will be described in detail below.

Figure 6:
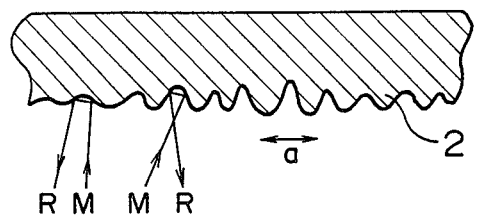
FIG. 6 is a partial sectional view of the activation surface.

FIG. 6 is a fragmental sectional view of another embodiment of the activation surface 2. As the surface has unevenness as shown in the drawing, the gas particles impinge against the activation surface 2 usually a plural number of times, resulting in an elevated activation efficiency. The size of unevenness is preferably not greater than several mm.

Figure 7A:
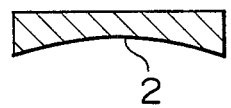
FIGS. 7a to 7c are the sectional views of the activation surfaces.
Figure 7B:
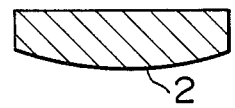
Figure 7C:
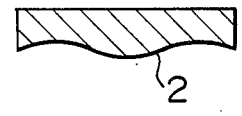

FIGS. 7a, 7b and 7c show the sectional shapes of other examples of activation surface 2. Curvature of the activation surface provides a change in interval between activation surface 2 and sample 3, making it possible to control the flow rate of reaction gas supplied into the central part of the sample 3. This enables control of the particle flux entering the surface of the sample 3 and proves effective for improving the uniformity of the throughput speed. Curvature of the activation surface is preferably such that it represents a rotational symmetry relative to the center axis (normal line of the plane at the center) of the activation surface 2. The "rotational symmetry" referred to herein denotes a configuration in which when the system makes a turn through a specified angle (less than 360°) about the axis of rotation, said point returns to its original configuration.

Figure 8A:
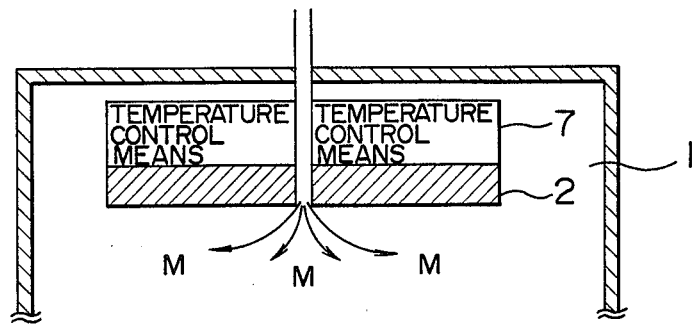
FIGS. 8a and 8b are the sectional views of the activation surfaces and their vicinity.
Figure 8B:
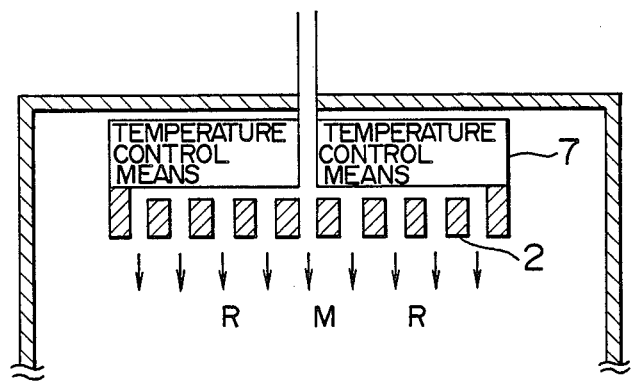

Enlargement of the size of sample 3 adversely affects the supply of gas particles to the central part of sample 3 and evacuation of the reaction product from the central part. As a result, uniformity of throughput speed is lost. For preventing this, it is effective to introduce the fed gas from the inside of the activation surface 2 (through the activation surface 2). In the embodiment of FIG. 8a, gas is introduced from the center of the activation surface 2, and in the embodiment of 8b, gas is introduced through the entirety of the porous activation surface 2. Such arrangements make it possible to supply the gas flow uniformly to the sample surface.

Figure 2:
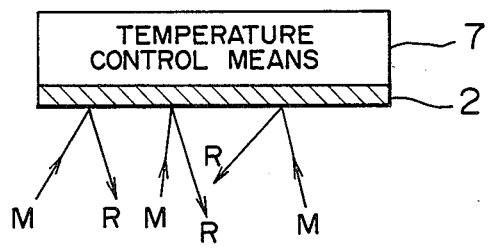
FIG. 2 is a sectional view of an activation surface and its vicinity.

The process for introducing $Cl_2$ gas into reaction chamber 1 and turning hot molecules of $Cl_2$ into activated particles R for effecting etching on the sample surface will be described in detail below while referring to FIGS. 2 and 3.

Figure 3:
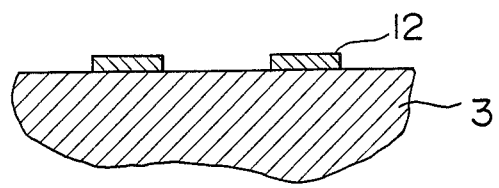
FIG. 3 is a partial sectional view of a sample for etching.

FIG. 3 shows a fragmental sectional view of the sample 3 to be etched. On the surface of the sample 3 is formed a mask 12 describing a pattern to be formed on the substrate surface by etching (or a pattern which becomes the prototype of the pattern to be formed). A material which is hardly etched, such as silicon oxide ($SiO_2$), silicon nitride ($Si_3N_4$) and polymer films such as photoresist are suited for use as the material for forming the mask 12. The substance to be etched (shown as sample 3 here) may be the surface of the substrate material or the thin film formed on the substrate surface.

$Al_2O_3$ and $SiO_2$, which are hardly reacted with $Cl_2$, are suited for use as the material of activation surface 2. Use of C or Si-C is also advantageous as such substance serves for removing Cl radicals formed on the surface in the form of $CCl_n$, thereby reducing the vaneful effects of Cl radicals in etching work. An example of said vaneful effects is reaction of Cl radicals with the Si sample surface to conduct undesired etching. The surface of such metals as W, Mo, Ta, Ti, Nb, Pt, etc., can be also utilized as activation surface 2 for the same reasons as described above. The activation surface is heated under control by indirect heating or direct Joule heating so that Ta is kept in the range of 100° to 2,000° C. Precision of temperature control can be bettered by arranging the activation surface temperature control means 7 so that it would have both heating and cooling functions.

Part of the $Cl_2$ molecules staying in reaction chamber 1 enter the activation surface 2 and become activated particles of hot molecules, which are then released from the surface. When it is supposed that the angle made by the direction of release of active particle R and the normal line on the activation surface at the site of release is $\theta$ and the number of the active particles released in a unit time within a solid angle $d\Omega$ in the direction of $\theta$ is $N(\theta) \, d\Omega$, then $N(\theta)$ is roughly given as follows:

$$N(\theta) = No \cos\theta \qquad (3)$$

wherein No is the value of $N(\theta)$ when $\theta = 0$. Also, the number of active particles of $Cl_2$ (N) formed in a unit time in a unit area of activation surface is proportional to the pressure ($Pcl_2$) of $Cl_2$ (molecules in the case of a gas mixture), and N is roughly given as:

$$N = 6.5 \times 10^{20} Pcl_2 \qquad (4)$$

The units of N and $Pcl_2$ are particles/sec·cm² and Torr, respectively.

The thus formed active particles R of $Cl_2$ (hereinafter referred to as $Cl_2^*$) fly in the reaction chamber 1 and reach the surface of sample 3. In this case, when gas pressure Pr in reaction chamber 1 Pr $\simeq Pcl_2$ in case of using $Cl_2$ gas alone) is high, $Cl_2^*$ tend to collide with the background gas particles in the reaction chamber before reaching the sample surface and are disturbed in the flying direction. Thus, the number of the particles which move straight on is decreased, resulting in a reduced throughput of the directional process. For preventing such collision of $Cl_2^*$ with background gas particles, it is necessary that the following relation be satisfied:

$$l \leq \lambda \qquad (5)$$

wherein l is the distance between the activation surface 2 and the surface of sample 3, and $\lambda$ is the mean free path of $Cl_2^*$ in reaction chamber 1 (namely the distance that the particles fly until the direction of movement changes by 90°).

On the other hand, the mean free path $\lambda$ is inversely proportional to gas pressure Pr and roughly given as:

$$\lambda = 5 \times 10^{-3}/Pr \qquad (6)$$

Here, the units of $\lambda$ and Pr are cm and Torr, respectively. Since gas pressure Pr at the time of ordinary treatment is Pr $\geq 1 \times 10^{-5}$ Torr, it is desirable that $l \leq 500$ cm from the formulae (5) and (6). A further increase of gas flow rate raises the gas pressure to Pr $\geq 1 \times 10^{-4}$ Torr, but generally $l \leq 50$ cm. If l is too small, there won't be given sufficient supply of $Cl_2$ gas to the space between the activation surface 2 and the surface of sample 3, and no sufficient evacuation of reaction product will be made, giving rise to troubles such as increased gas pressure in said spacer and a too short mean free path. For preventing this, it is desirable that $l \leq 1$ mm. Considering all the matters described above, it is desirable that the distance l between the activation surface 2 and the surface of sample 3 is:

$$1 \text{ mm} \leq l \leq 500 \text{ cm} \qquad (7)$$

but usually, it is desirable that l is:

$$1 \text{ mm} \leq l \leq 50 \text{ cm} \tag{8}$$

Where the condition of the formula (5), (7) or (8) is satisfied, it is possible to control the direction of the active particles $Cl_2^*$ reaching the sample surface by setting a collimator 9 between activation surface 2 and sample 3.

Figure 4:
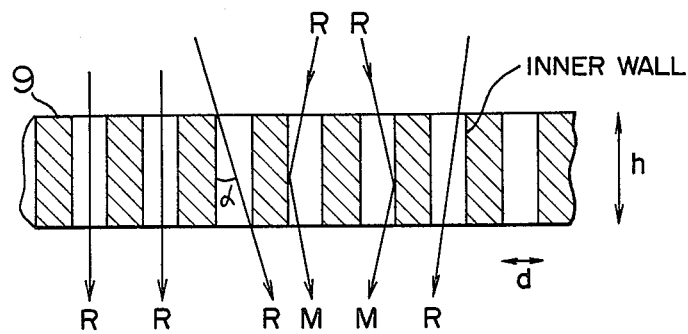
FIG. 4 is a partial sectional view of a collimeter.

The function of the collimator 9 will be described below with reference to FIGS. 1 and 4. A partial sectional view of the collimeter 9 is shown in FIG. 4. Collimator 9 is made of a plate having one or a plurality of pores. The material constituting the pores is controlled in temperature by heating or cooling as required. Usually it is cooled. Water cooling will do for such cooling. For cooling to a lower temperature, cooling by liquid nitrogen can be employed. Collimator 9 is preferably made of a material having excellent thermal conductivity and high resistance to chemical reaction, such as Al, Cu, quartz, alumina and the like. It is also possible to use a well heat conductive material (Al, Cu, etc.) having its surface (especially inner walls of pores) coated with a chemical-resistant material (quartz, alumina, Teflon, polymer material, Au, Pt, etc.).

When an active particle R passes through a pore in collimator 9 without touching the inner wall of the pore, such particle R remains active even after passing through the collimator. However, when the active particle R runs against the inner wall of a pore, it is deprived of its translational energy and internal energies (vibrational, rotational and electronic state energies) by the inner wall and is deactivated to return to the inactive particle M. Also, the particle may be absorbed on the inner wall and won't come out into the gas phase again. Further, when the particle R is electrically charged, it is neutralized on running against the inner wall of the pore and becomes a non-charged particle. It is seen from the above that an active particle R can remain active even after passing through the collimator 9 only when the particle passes through a pore therein without touching the surface of the collimator material. This means that only those of the active particles R which fly in the direction coincident with the direction of pores can pass through the collimator 9 and reach the sample surface while maintaining activity. The maximum allowable angle $\alpha$ through which an active particle can fly when passing through the collimator 9 without touching the inner wall of the pore is given as follows:

$$\tan\alpha = d/h \tag{9}$$

wherein d is the pore diameter and h is the pore length. $\alpha$ represents the angle made by the direction of pore and the flying direction of active particle.

Figure 5A:
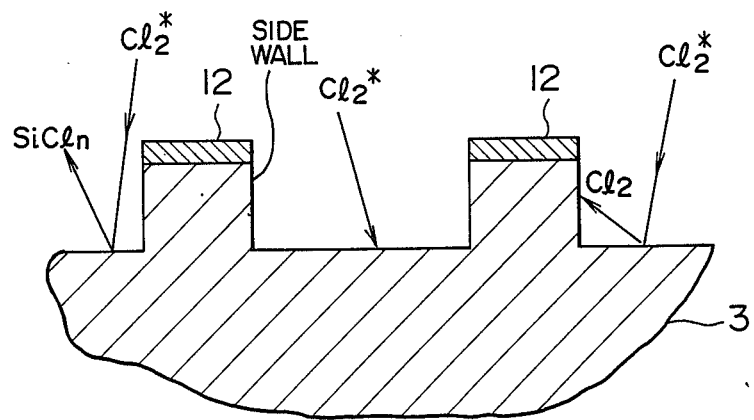
FIGS. 5a and 5b are the partial sectional views of the etched samples.

In the apparatus of FIG. 1, the hot molecules of $Cl_2$ ($Cl_2^*$), which have been formed in the manner described and uniform in the flying direction, reach the surface of sample 3, and when the temperature Ts of sample 3 is kept below a specified level by a temperature control means 8, the mask pattern can be transferred faithfully to the substrate along the direction of entrance of $Cl_2^*$ with no undercut. FIG. 5a illustrates a manner in which an Si substrate is etched as described above. Shown in FIG. 5a is the case where $Cl_2^*$ reach almost vertically to the sample surface, but even when they reach aslant, the similar effect can be attained to realize etching along the direction of incidence of $Cl_2^*$.

Realization of said etching with no undercut can be accounted for by the following facts.

Figure 5B:
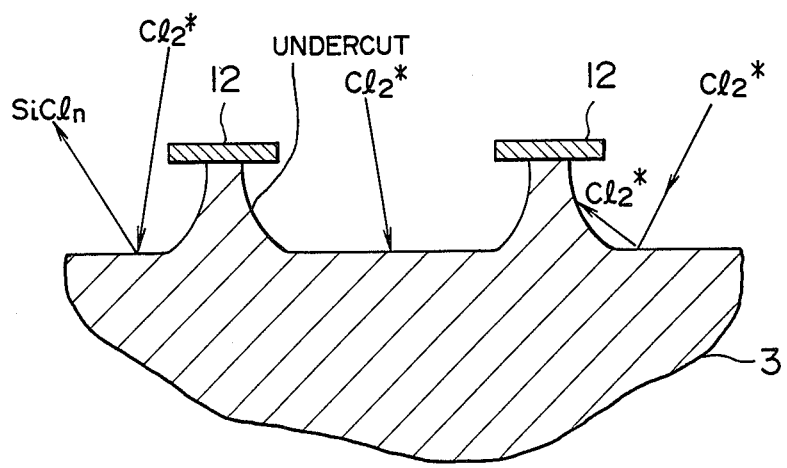

When $Cl_2^*$ reach the surface of sample 3, part of them undergo the following reaction:

$$Si + \frac{n}{2} Cl_2^* \rightarrow SiCl_n \uparrow \tag{10}$$

to form the reaction product $SiCl_n$ (n=1 to 4). As this reaction product is released from the surface of sample (Si) 3, this surface is etched. However, part of $Cl_2^*$ incident to the sample surface are released (reflected) from the surface without undergoing a reaction. If these reflected $Cl_2$ molecules remain active particles (viz. $Cl_2^*$), they will etch the pattern side wall on reaching it to form an undercut (see FIG. 5b). However, when the temperature Ts of the sample surface is kept low, $Cl_2^*$ are deprived of their translational and internal energies by the sample surface and deactivated when reflected to become inactive $Cl_2$ molecules and lose reactivity. These $Cl_2$ molecules perform no etching even when reaching the side wall, so that the mask pattern can be transferred with no undercut. The test results show that $Ts \leq 400°$ C. is desirable for carrying out such etching without undercutting.

According to the experiments, when the activation surface temperature Ta is set at 800° C. and the sample temperature Ts is controlled at 200° C., the probability of $Cl_2^*$ reaching the sample surface to undergo the reaction of formula (10) is approximately $2 \times 10^{-3}$. When it is supposed that $Pcl_2 = Pr = 1 \times 10^{-3}$ Torr, then N is given as follows from formula (4): $N = 6.6 \times 10^{17}$ particles per sec. per cm². Supposing that 10% of these particles pass through the collimator 9, it follows that $6.6 \times 10^{16}$ particles/(sec. cm²) of $Cl_2^*$ reach the sample surface per unit time and unit area. When these $Cl_2^*$ particles undergo the reaction of formula (10) to form the reaction product $SiCl_4$ to thereby perform etching, an etching speed $\epsilon$ of 400 (nm/min) can be realized. For carrying out directional etching, it is necessary that $l \leq 5$ from formulae (5) and (6).

When an Si wafer with a diameter of 6 inches is etched as sample 3 at said etching speed, $1.2 \times 10^{19}$ $Cl_2$ molecules are consumed every second by the reaction. This corresponds to 30 sccm in terms of flow rate. Therefore, in order that about 10% of the $Cl_2$ gas molecules introduced into reaction chamber 1 may be reacted, it is necessary to introduce $Cl_2$ gas into reaction chamber 1 at a flow rate of about 300 sccm. In this case, for maintaining Pr at $1 \times 10^{-3}$ Torr, it needs to use a pump having a evacuation capacity of 3,800 l/s. When the conditions are arranged as described above, the $Cl_2$ molecules introduced into reaction chamber 1 will have the chance of reaching the sample surface in the form of $Cl_2^*$ and being reacted with the sample surface about 50 times on the average. This can be appraised as an outstanding feature of this invention in view of the fact that in the prior art (as for instanced disclosed in Japanese Patent Application Kokai (Laid-Open) No. 62-35521) $Cl_2^*$ were allowed to have the chance of reacting with the surface only once on the average. This, also, accounts for the realization of high throughput by the present invention. It is liable that part of the $Cl_2$ molecules be decomposed and ionized on activation surface 2 to form $Cl^-$. Therefore, it is possible to accelerate or decelerate $Cl^-$ toward sample 3 (in an extreme case, decelerate $Cl^-$ so that it can not reach the sample surface) by applying a voltage to the sample by a voltage supply means 11. Either DC or AC (low-frequency or high-frequency) voltage may be used according to the purpose of use.

It is liable that the sample surface be heated by heat radiation from activation surface 2. Heated sample may give rise to some serious problems such as degeneration of resist mask, unnecessary progress of reaction, etc.

Means for preventing such heating of sample will be discussed below.

The radiant energy released from a unit area of activation surface 2 is given as follows:

$$Q = \sigma T a^4 \quad (11)$$

$\sigma$: emissivity of activation surface.

When $\sigma$ is represented by black-body emissivity $\sigma_o$, the following equation is given: $\sigma = 5.7 \times 10^{-2}$ (J/cm$^2$·Sec$^4$). Supposing Ta=800° C. =1,073 k, then Q =7.6J/cm$^2$·sec=7.6watt/cm$^2$. Assuming that 1/10 of the radiant energy reach the sample surface, it follows that sample 3 receives a heat of 0.76 watt/cm$^2$. In the case of such level of heat, it is possible to maintain sample temperature Ts below 100° C. by water-cooling sample holder 4 and pressingly securing sample 3 on said sample holder 4. In case a large volume of heat is applied to the sample surface, a gas (preferably an inert gas such as He or Ar) is introduced between sample 3 and sample holder 4 (gas pressure being desirably 10$^{-3}$ to 10 Torr) so as to better heat contact between sample 3 and sample holder, which proves effective for preventing heating of sample 3.

Although Cl$_2$ gas was used as the gas to be introduced in the above example, it is possible to use other molecular gas containing a halogen element such as F$_2$, FCl, SF$_6$, NF$_3$, CF$_4$, etc., for producing the same effect. Also, Si was taken up as the material to be etched in the above example, desired etching can be similarly accomplished by using other Si-containing materials, materials containing Ga, As, P or the like, and metals such as Al, Mo, W, Ta, Nb, Ni, Ti, etc. Such etching can be also conducted with carbons (graphite, polycrystalline carbon, diamond, etc.) or organic polymers. In this case, it is advisable to use a molecular gas containing O$_2$ or oxygen element as introduction gas.

The process in the above-described embodiments of this invention can be applied not only to etching but also to surface reforming such as oxidization, nitriding, etc., deposition, epitaxy and the like. Such applications are implied in the prior art disclosures (such as Japanese Patent Application Kokai (Laid-Open) No. 61-113775. An outstanding feature of the present invention resides in remarkably high throughput in comparison with the prior art disclosures.

Figure 9:
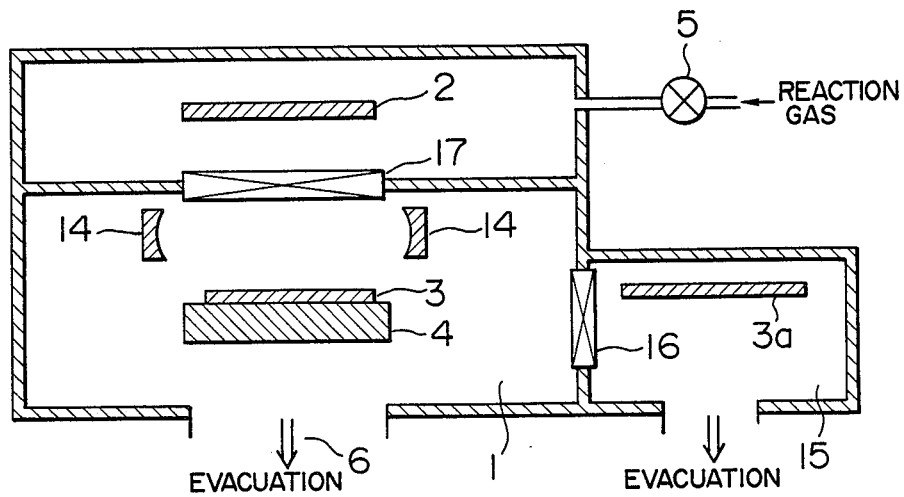
FIG. 9 is a sectional view of another embodiment of the present invention.

Another embodiment of this invention is shown in FIG. 9. By forming a magnetic field between surface 2 and sample surface by electromagnets 14, it is possible to transfer the charged particles (for example Cl$^-$) effectively to the sample surface or to prevent said particles from eaching the sample surface. That is, vertical arrangement of the direction of magnetic line of force to the surface of sample 3 allows effective transfer of Cl$^-$ while parallel arrangement can prevent Cl$^-$ from reaching the surface of sample 3. The suitable strength of magnetic field is 10 to 1,000 Gauss.

When Cl$_2$ is used as reaction gas, NaCl is deposited as impurities on the activation surface 2, so that Na$^+$ or Cl$^-$ are generated from the surface. Since Na contamination gives a serious influence to the properties of semiconductor devices, it is of great practical account to try to inhibit Na$^+$ from reaching the surface of sample 3 by said method.

When using the activation surface 2 by heating it to a high temperature, it is necessary to cool the activation surface 2 close to room temperature before leaking atmospheric pressure into reaction chamber 1 for exchanging the sample 3. After exchange of sample 3, the activation surface 2 must be again heated to a high temperature. This is necessary for preventing the high-temperature activation surface 2 from being degenerated upon contacting the atmosphere. Such cooling and reheating, however, are quite time-consuming and disadvantageous in terms of throughput capacity. For preventing this, it is effective to provide a spare chamber 15 for introduction of sample, in addition to reaction chamber 1, and connect both chambers by a gate valve. In operation, fresh sample 3a is placed in spare chamber 15, and after evacuating the spare chamber, gate valve 16 is opened to exchange the used sample 3 with fresh one. This enables sample exchange without exposing activation surface 2 to the atmosphere and shortens the time required for cooling and re-heating of activation surface 2. A similar effect can be obtained by providing a gate valve 27 between activation surface 2 and sample 3 so that exchange of sample can be made by tightening said gate valve 17. In FIG. 9, other elements are the same as used in the embodiment of FIG. 1. Also, in FIG. 9, both spare chamber 15 and gate valve 17 are shown for the purpose of explanation, but actually one of them suffices for meeting the requirement.

In the embodiments described above, particles M for forming activated particles R were supplied in the form of gas into reaction chamber 1, but it is also possible to form activated particles R by spreading or holding particles M for forming activated particles R on the activation surface 2 or in the material forming the activation surface. For instance, by spreading NaCl on the W surface and then heating said W surface (Ta≧1,000° C.), there can be formed the activated particles of Na, Cl, Na+, Cl−, etc.

The present invention can realize a surface process of high throughput as the gas particles are introduced to reach the surface of sample which has been activated a plural number of times on the average. Also, because of use of active particles of low energy, there can be achieved a low-temperature surface process with little damage, low contamination and high selectivity. Further, the present invention can realize a directional surface process by use of a collimeter.

The method and apparatus of this invention can be utilized in combination with other known surface treating techniques. For instance, the work surface may be first treated by a known surface treating technique using plasma, light, or ion beams and then further treated by using the method and apparatus of this invention to further improve throughput. A combination in the reverse order is also possible.

What is claimed is:

1. An apparatus for surface treating a sample article with activated particles, comprising a reaction chamber in which a sample article to be surface treated is placed, means for introducing a reaction gas into said reaction chamber, an activation surface set in said reaction chamber and arranged capable of activating at least one part of the particles composing said reaction gas, and means for evacuating the reaction gas out of said reaction chamber.

2. The surface treating apparatus according to claim 1, wherein said activation surface has a temperature higher than room temperature.

3. The surface treating apparatus according to claim 1, wherein said activation surface has a catalytic action.

4. The surface treating apparatus according to claim 1, wherein said activation material is made of at least one material selected from $SiO_2$, $Al_2O_3$, C, Si, and Si-C.

5. The surface treating apparatus according to claim 1, wherein said activation surface is made of at least one kind of metal selected from W, Mo, Ta, Ti, Ni, Nb and Pt, or a mixture or an alloy of two or more kinds of metal selected from said metals.

6. The surface treating apparatus according to claim 1, wherein said activation surface comprises at least one kind of material selected from stainless steel, $ZrO_2$, W, $TiO_2$, congelite and $SiO_2$.

7. The surface treating apparatus according to claim 1, having means for controlling the temperature Ta of said activation temperature in the range of 100 to 3,000° C.

8. The surface treating apparatus according to claim 1, having means for controlling the temperature Ta of said activation surface and the temperature Ts of sample surface independently of each other.

9. The surface treating apparatus according to claim 8, having means for controlling said temperatures Ta and Ts so that $Ta < Ts$ or $Ts \leqq 400°$ C.

10. The surface treating apparatus according to claim 1, wherein said activation surface has unevenness.

11. The surface treating apparatus according to claim 1, wherein said activation surface describes a curvature.

12. The surface treating apparatus according to claim 1, wherein said activation surface has a configuration of rotational symmetry.

13. The surface treating apparatus according to claim 1, wherein said gas is introduced through said activation surface.

14. The surface treating apparatus according to claim 1, having means for applying a voltage to said sample.

15. The surface processing apparatus according to claim 1, having means for applying a magnetic field between said activation surface and said sample.

16. The surface treating apparatus according to claim 1, wherein said gas comprises entirely or partly of the molecules containing a halogen element.

17. The surface treating apparatus according to claim 16, wherein said sample surface is etched.

18. The surface treating apparatus according to claim 1, wherein said gas comprises entirely or partly of the molecules containing oxygen or nitrogen element.

19. The surface treating apparatus according to claim 18, wherein said sample surface is oxidized or nitrided.

20. The surface treating apparatus according to claim 1, wherein the atoms contained in said reaction gas are deposited or epitaxially grown on said sample surface.

21. The surface treating apparatus according to claim 1, wherein the distance between said activation surface and the surface of said sample is shorter than the mean free path of said active particles.

22. The surface treating apparatus according to claim 1, wherein the distance between said activation surface and the surface of said sample is 50 cm to 1 mm.

23. The surface treating apparatus according to claim 1, wherein a collimeter is provided between said activation surface and said sample.

24. The surface treating apparatus according to claim 23, having means for controlling the temperature of said collimeter.

25. The surface treating apparatus according to claim 1, wherein a gate valve is provided between said activation surface and said sample.

26. The surface treating apparatus according to claim 1, wherein an auxiliary evacuation chamber designed for making an exchange of sample is provided beside said reaction chamber, and said reaction chamber and auxiliary evacuation chamber are connected by a gate valve.

27. An apparatus for surface treating a sample article with active particles, comprising a reaction chamber in which a sample article to be surface processed is placed, and an activation surface set in said reaction chamber and arranged capable of forming active particles.

28. The surface treating apparatus according to claim 27, having means for introducing a reaction gas into said reaction chamber from an outside source, and means for evacuating the used reaction gas out of said reaction chamber, wherein the particles in said reaction gas are ativated by said activation surface.

29. The surface treating apparatus according to claim 27, wherein the particles to be made into active particles are carried on said activation surface or in the material forming such activation surface.

30. An apparatus for surface treating a sample article with active particles, comprising a sample article to be surface treated, an activation surface for forming the active particles, and means for holding said sample article and activation surface under a substantially same pressure.

31. An apparatus for surface treating a sample article with active particles formed by an activation surface, comprising a sample article to be surface processed, an activation surface for forming active particles, and means for holding said sample article and activation surface under a same atmosphere.

32. A method for surface treating a sample article with active particles formed by an activation surface, characterized in that the sample article to be surface treated and the activation surface for forming the active particles are maintained under a same atomsphere.

* * * * *